US012776376B2

United States Patent

(12) United States Patent
Chen et al.

(10) Patent No.: US 12,776,376 B2
(45) Date of Patent: Oct. 27, 2026

(54) MEMORY DEVICE AND PRE-CHARGE METHOD

(71) Applicant: MACRONIX INTERNATIONAL CO., LTD., Hsinchu (TW)

(72) Inventors: Che-Ping Chen, Taipei City (TW); Ya-Jui Lee, Taichung City (TW); Yu-Hung Huang, Tainan City (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 558 days.

(21) Appl. No.: 18/356,297

(22) Filed: Jul. 21, 2023

(65) Prior Publication Data

US 2025/0029666 A1 Jan. 23, 2025

(51) Int. Cl.
*G11C 16/34* (2006.01)

(52) U.S. Cl.
CPC ................................ *G11C 16/3427* (2013.01)

(58) Field of Classification Search
CPC ............................ G11C 16/3427; G11C 16/08
USPC ..................................................... 365/185.02
See application file for complete search history.

(56) References Cited

U.S. PATENT DOCUMENTS

| | | | | |
|---|---|---|---|---|
| 7,952,929 | B2 | 5/2011 | Kim et al. | |
| 10,192,620 | B2 | 1/2019 | Kim et al. | |
| 11,056,195 | B1 | 7/2021 | Liu | |
| 12,159,665 | B2 * | 12/2024 | Cui | G11C 16/24 |
| 2007/0019484 | A1 | 1/2007 | No | |
| 2022/0157393 | A1 * | 5/2022 | Park | G11C 11/5671 |

FOREIGN PATENT DOCUMENTS

| | | | | | |
|---|---|---|---|---|---|
| CN | 108335711 | A | | 7/2018 | |
| CN | 104425008 | B | * | 5/2019 | G11C 11/413 |
| CN | 122227581 | A | * | 6/2026 | H10W 90/00 |
| KR | 100763078 | B1 | | 10/2007 | |
| TW | 200841341 | A | | 10/2008 | |
| TW | 200901198 | A | | 1/2009 | |
| TW | 202008367 | A | | 2/2020 | |

* cited by examiner

*Primary Examiner* — Joshua L Schwartz
(74) *Attorney, Agent, or Firm* — McClure, Qualey & Rodack, LLP

(57) ABSTRACT

Provided are a memory device and a pre-charge method for a memory device. The pre-charge method includes: applying a plurality of independently-controlled pre-charge voltages to a plurality of turned-on word lines, wherein the plurality of pre-charge voltages are selected among a plurality of reference pre-charge voltages; and applying a plurality of turned-off voltages to a plurality of turned-off word lines. On a predetermined direction, a target turned-on word line among the plurality of turned-on word lines is adjacent to a next adjacent target turned-off word line among the plurality of turned-off word lines; and a voltage difference from the target turned-on word line toward the next adjacent target turned-off word line is smaller than a predetermined reference voltage difference.

8 Claims, 8 Drawing Sheets

MEMORY DEVICE AND PRE-CHARGE METHOD

TECHNICAL FIELD

The disclosure relates in general to a memory device and a pre-charge method thereof.

BACKGROUND

Along with the increased storage density of the memory device, how to obtain a better read window is more and more important. Program disturbance is one of the factors impacting the read window. Too high program voltage, not enough boosting channel at inhibited cells or abrupt slope of the boosting channel may reduce the read window and thus the performance of the memory device is lowered.

Abrupt slope of the channel level may possibly incur hot carrier injection (HE) effects and thus reduce the read window. In the conventional pre-charge method, the pre-charge word lines are applied by the same voltage. If the voltage difference between the adjacent pre-charge turned-on word line and the pre-charge turned-off word line is too high, HE effects incur and thus the read window is smaller.

FIG. 1 shows conventional HE effects. In FIG. 1, CSL refers to a common source line, GSL refers to a global source line, SSL refers to a string select line, and BL refers to a bit line. As shown in FIG. 1, in the pre-charge phase, the word lines WL0, WL4, WL5 . . . are turned off and the word lines WL1-WL3 are turned on. Here, for example, the turned-off voltage applied to the word lines WL0, WL4, WL5 . . . are 0V while the turned-on voltage applied to the word lines WL1-WL3 are 4.5V. It is assumed that the word lines WL0-WL3 are at erased states (eR) (having a lowest threshold voltage) while the word lines WL4 and WL5 are at the state G (having a highest threshold voltage). At the boundary between the word lines WL3 and WL4, the voltage difference is 4.5−0=4.5V, which is high. The high voltage difference incurs the HE effects, results smaller read window and suffers from program disturbance which negatively affects performance of the memory device.

There is an industry effort to prevent the HE effects for obtaining better read window and thus increasing memory device performance.

SUMMARY

According to one embodiment, provided is a pre-charge method for a memory device, the pre-charge method comprising: applying a plurality of independently-controlled pre-charge voltages to a plurality of turned-on word lines, wherein the plurality of pre-charge voltages are selected among a plurality of reference pre-charge voltages; and applying a plurality of turned-off voltages to a plurality of turned-off word lines. On a predetermined direction, a target turned-on word line among the plurality of turned-on word lines is adjacent to a next adjacent target turned-off word line among the plurality of turned-off word lines; and a voltage difference from the target turned-on word line toward the next adjacent target turned-off word line is smaller than a predetermined reference voltage difference.

According to another embodiment, provided is a memory device comprising: a memory array; a driving circuit coupled to and driving the memory array; and a memory control circuit coupled to and controlling the driving circuit. In a pre-charge phase, under control of the memory control circuit, the driving circuit applies a plurality of independently-controlled pre-charge voltages to a plurality of turned-on word lines of the memory array, wherein the plurality of pre-charge voltages are selected among a plurality of reference pre-charge voltages; and under control of the memory control circuit, the driving circuit applies a plurality of turned-off voltages to a plurality of turned-off word lines of the memory array. On a predetermined direction, a target turned-on word line among the plurality of turned-on word lines is adjacent to a next adjacent target turned-off word line among the plurality of turned-off word lines; and a voltage difference from the target turned-on word line toward the next adjacent target turned-off word line is smaller than a predetermined reference voltage difference.

Figure 1:
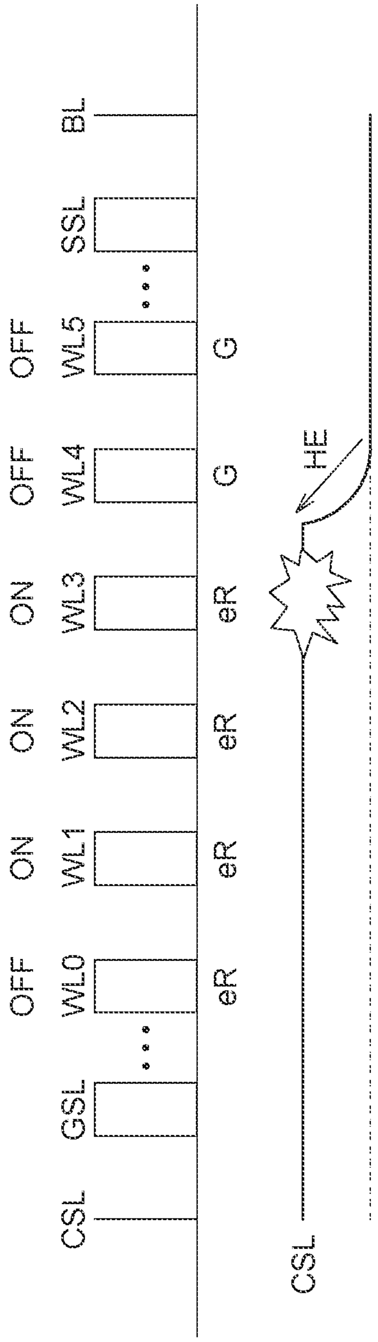
FIG. 1 shows conventional HE effects.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DESCRIPTION OF THE EMBODIMENTS

Technical terms of the disclosure are based on general definition in the technical field of the disclosure. If the disclosure describes or explains one or some terms, definition of the terms is based on the description or explanation of the disclosure. Each of the disclosed embodiments has one or more technical features. In possible implementation, one skilled person in the art would selectively implement part or all technical features of any embodiment of the disclosure or selectively combine part or all technical features of the embodiments of the disclosure.

Figure 2:
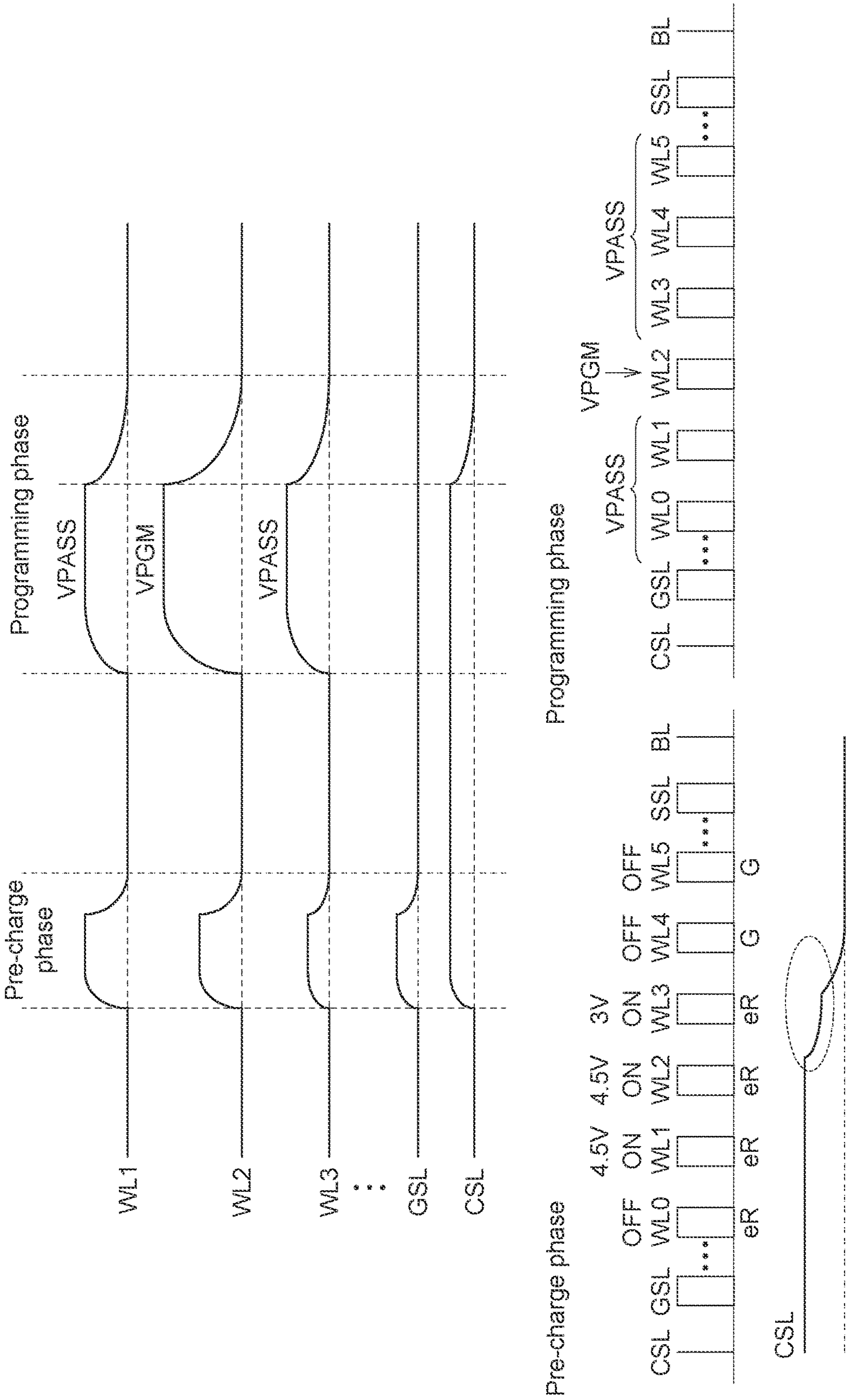
FIG. 2 shows operation waveforms of a memory device according to one embodiment of the application.

FIG. 2 shows operation waveforms of a memory device according to one embodiment of the application. FIG. 2 shows several word lines WL0-WL5 which is not to limit the application. In the following, the word lines WL1-WL3 are turned on while other words WL0, WL4, . . . are turned off, which is just an example and not to limit the application. Here, it is assumed that the word lines WL0-WL3 are at the erased states (eR) while the word lines WL4 and WL5 are at the state G (having highest threshold voltage). Programming the word line WL2 is for an example and the application is not limited by this. The turned-off voltages applied to the word lines WL0, WL4, WL5 are 0V which is not to limit the application. In the following, during the pre-charge phase, the word lines (for example WL1-WL3 etc.) which are turned on are also referred as the turned-on word lines; and similarly, the word lines (for example WL0, WL4 etc.)

which are turned off are also referred as the turned-off word lines. In the pre-charge phase, the common source line CSL and the global source line GSL are turned on; the string select line SSL is turned off, and the bit line BL is turned on (the inhibited string) or turned off (the non-inhibited string) according whether the bit line BL is in the inhibited string or non-inhibited string.

As shown in FIG. 2, in the pre-charge phase, for example but not limited by, the pre-charge voltages applied to the turned-on word lines WL1-WL3 are 4.5V, 4.5V and 3V, respectively. At the boundary between the word line WL3 (which is turned-on and has a lowest threshold voltage) and the word line WL4 (which is turned-off and has a highest threshold voltage), the voltage difference is 3−0=3V which is small. The small voltage difference reduces the HE effects and results a larger read window. Thus, the program disturbance is eliminated and the performance of the memory device is not negatively affected. Still further, in FIG. 2, at the boundary between the word line WL3 (which is turned-on and has a lowest threshold voltage) and the word line WL4 (which is turned-off and has a highest threshold voltage), the voltage of the common source line CSL is gradiently lowered (i.e. gradually decreased). By so, one embodiment of the application may reduce the HE effect, compared with the prior art.

During the program phase, a program voltage VPGM is applied to the word line WL2 and a pass voltage VPASS is applied to other word lines WL0-WL1, WL3-WL5, . . . . In the program phase, the common source line CSL is turned on; the string select line SSL and the global source line GSL are turned off, and the bit line BL is turned on (the inhibited string) or turned off (the non-inhibited string) according whether the bit line BL is in the inhibited string or non-inhibited string.

In other possible embodiments of the application, during the pre-charge phase, the pre-charge voltages applied to the turned-on word lines have many variations and are not limited by FIG. 2. Some examples are described which are not to limit the application.

Figure 3A:
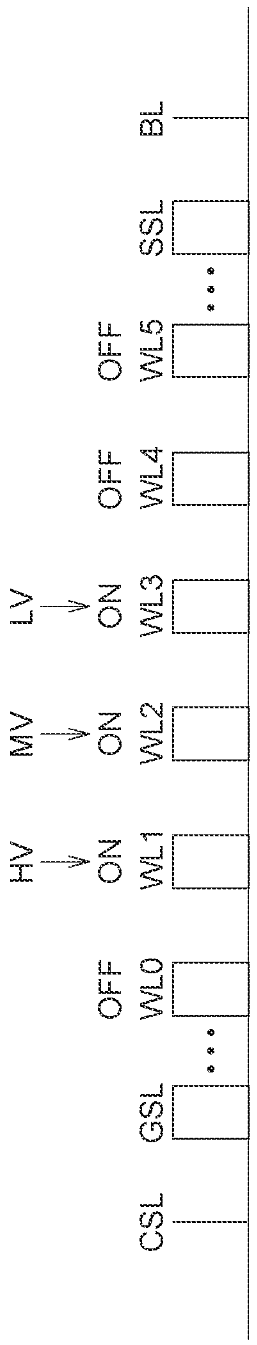
FIG. 3A to FIG. 3D show operations during the pre-charge phase of the memory device according to one embodiment of the application.

FIG. 3A to FIG. 3D show operations during the pre-charge phase of the memory device according to one embodiment of the application. As shown in FIG. 3A, during the pre-charge phase, for example but not limited by, the pre-charge voltages applied to the turned-on word lines WL1-WL3 are a high reference pre-charge voltage HV, a middle reference pre-charge voltage MV and a low reference pre-charge voltage LV wherein HV>MV>LV. As shown in FIG. 3A, at the boundary between the turned-on word line WL3 (also referred as a target turned-on word line) and the next adjacent turned-off word line WL4 (also referred as a target turned-off word line), the voltage difference is LV−0=LV, which is a small voltage difference (that is, the voltage difference is smaller than a predetermined reference voltage difference). The small voltage difference reduces the HE effects and eliminates the reduction in the read window. Also, the program disturbance is eliminated and the performance of the memory device is kept. In one embodiment of the application, the target turned-on word line is defined as, on a predetermined direction, the turned-on word line which is adjacent to the turned-off word line; and the target turned-off word line is defined as, on the predetermined direction, the turned-off word line which is adjacent to the turned-on word line. In one embodiment of the application, the predetermined direction is from the common source line CSL toward to the bit line BL. The predetermined reference voltage difference is corresponding to a voltage difference between the high reference pre-charge voltage HV and the low reference pre-charge voltage LV. In one example, the predetermined reference voltage difference is equal to the voltage difference between the high reference pre-charge voltage HV and the low reference pre-charge voltage LV.

Figure 3B:
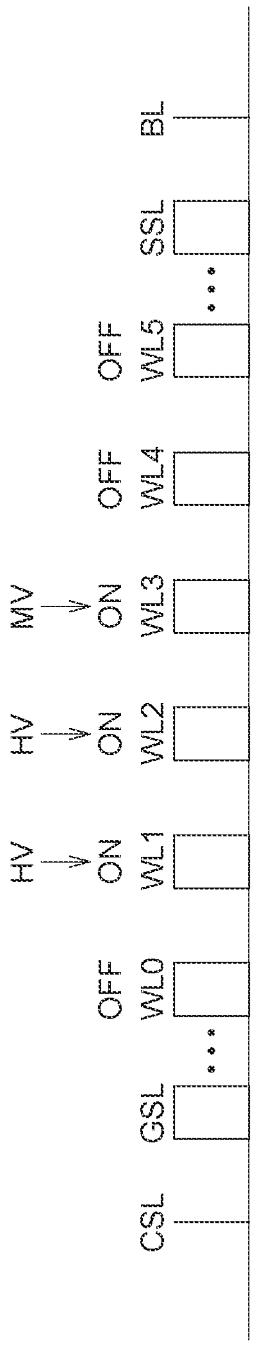

As shown in FIG. 3B, during the pre-charge phase, for example but not limited by, the pre-charge voltages applied to the turned-on word lines WL1-WL3 are the high reference pre-charge voltage HV, the high reference pre-charge voltage HV and the middle reference pre-charge voltage MV. As shown in FIG. 3B, at the boundary between the turned-on word line WL3 (also referred as a target turned-on word line) and the next adjacent turned-off word line WL4 (also referred as a target turned-off word line), the voltage difference is MV−0=MV, which is a small voltage difference. The small voltage difference reduces the HE effects and eliminates the reduction in the read window. Also, the program disturbance is eliminated and the performance of the memory device is kept.

Figure 3C:
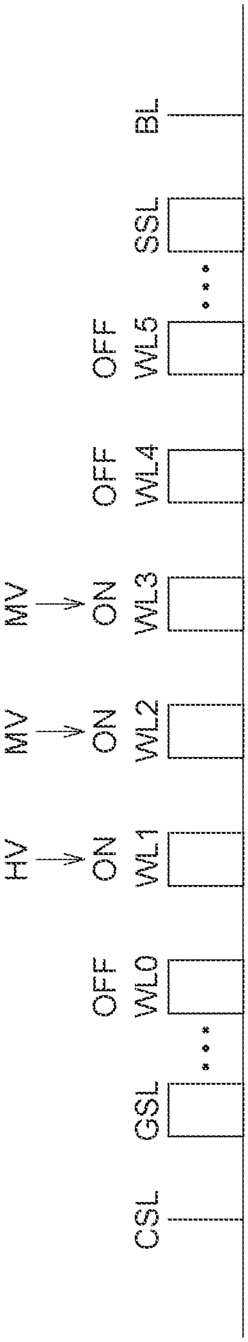

As shown in FIG. 3C, during the pre-charge phase, for example but not limited by, the pre-charge voltages applied to the turned-on word lines WL1-WL3 are the high reference pre-charge voltage HV, the middle reference pre-charge voltage MV and the middle reference pre-charge voltage MV. As shown in FIG. 3C, at the boundary between the turned-on word line WL3 (also referred as a target turned-on word line) and the next adjacent turned-off word line WL4 (also referred as a target turned-off word line), the voltage difference is MV−0=MV, which is a small voltage difference. The small voltage difference reduces the HE effects and eliminates the reduction in the read window. Also, the program disturbance is eliminated and the performance of the memory device is kept.

Figure 3D:
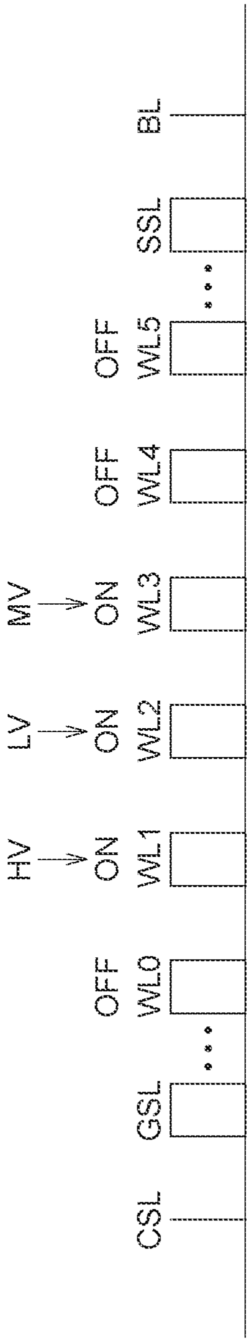

As shown in FIG. 3D, during the pre-charge phase, for example but not limited by, the pre-charge voltages applied to the turned-on word lines WL1-WL3 are the high reference pre-charge voltage HV, the low reference pre-charge voltage LV and the middle reference pre-charge voltage MV. As shown in FIG. 3D, at the boundary between the turned-on word line WL3 (also referred as a target turned-on word line) and the next adjacent turned-off word line WL4 (also referred as a target turned-off word line), the voltage difference is MV−0=MV, which is a small voltage difference. The small voltage difference reduces the HE effects and eliminates the reduction in the read window. Also, the program disturbance is eliminated and the performance of the memory device is kept.

Other possible embodiments of the application may have different pre-charge voltage settings. For convenience, the pre-charge voltage settings are summarized in table 1, which is not to limit the application. One skilled in the art would understand that there are still many possible pre-charge voltage settings, which are still within the spirit and the scope of the application.

TABLE 1

| | WL1 | WL2 | WL3 |
|---|---|---|---|
| Case 1 | HV | MV | LV |
| Case 2 | HV | HV | MV |
| Case 3 | HV | MV | MV |
| Case 4 | HV | LV | MV |
| Case 5 | MV | MV | LV |
| Case 6 | MV | LV | LV |
| Case 7 | MV | LV | MV |

From table 1, the pre-charge voltage applied to the target turned-on word line (for example but not limited by, the word line WL3 in FIG. 3A) may be the middle reference pre-charge voltage MV or the low reference pre-charge voltage LV; and the pre-charge voltage applied to the non-target turned-on word line (for example but not limited by, the word line WL1 or WL2 in FIG. 3A) may be the high reference pre-charge voltage HV, the middle reference pre-charge voltage MV or the low reference pre-charge voltage LV.

In one embodiment of the application, the high reference pre-charge voltage HV, the middle reference pre-charge voltage MV and the low reference pre-charge voltage LV are set as, for example but not limited by, 2~5V, 1~4V and 0~3V, respectively.

Figure 4A:
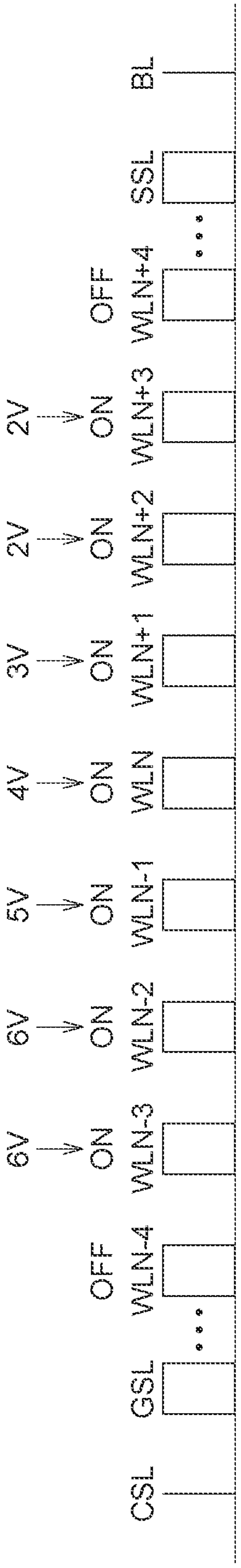
FIG. 4A to FIG. 4E show operations of the pre-charge phase of the memory device according to one embodiment of the application.

FIG. 4A to FIG. 4E show operations of the pre-charge phase of the memory device according to one embodiment of the application. As shown in FIG. 4A, during the pre-charge phase, for example but not limited by, at least seven word lines WLN−3~WLN+3 are turned-on while other word lines are turned-off. The pre-charge voltages applied to the turned-on word lines WLN−3~WLN+3 are 6V, 6V, 5V, 4V, 3V, 2V and 2V respectively, which are just for example and not to limit the application. As shown in FIG. 4A, at the boundary between the turned-on word line WLN+3 (i.e. the target turned-on word line) and the next adjacent turned-off word line WLN+4 (i.e. the target turned-off word line), the voltage difference is 2V−0=2V, which is a small voltage difference. The small voltage difference reduces the HE effects and eliminates the reduction in the read window. Also, the program disturbance is eliminated and the performance of the memory device is kept.

Figure 4B:
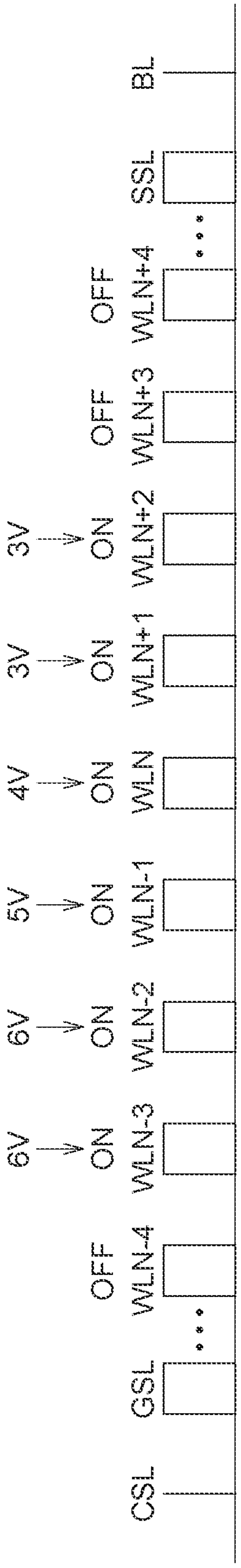

As shown in FIG. 4B, during the pre-charge phase, for example but not limited by, at least six word lines WLN−3~WLN+2 are turned-on while other word lines are turned-off. The pre-charge voltages applied to the turned-on word lines WLN−3~WLN+2 are 6V, 6V, 5V, 4V, 3V and 3V respectively, which are just for example and not to limit the application. As shown in FIG. 4B, at the boundary between the turned-on word line WLN+2 (i.e. the target turned-on word line) and the next adjacent turned-off word line WLN+3 (i.e. the target turned-off word line), the voltage difference is 3V−0=3V, which is a small voltage difference. The small voltage difference reduces the HE effects and eliminates the reduction in the read window. Also, the program disturbance is eliminated and the performance of the memory device is kept.

Figure 4C:
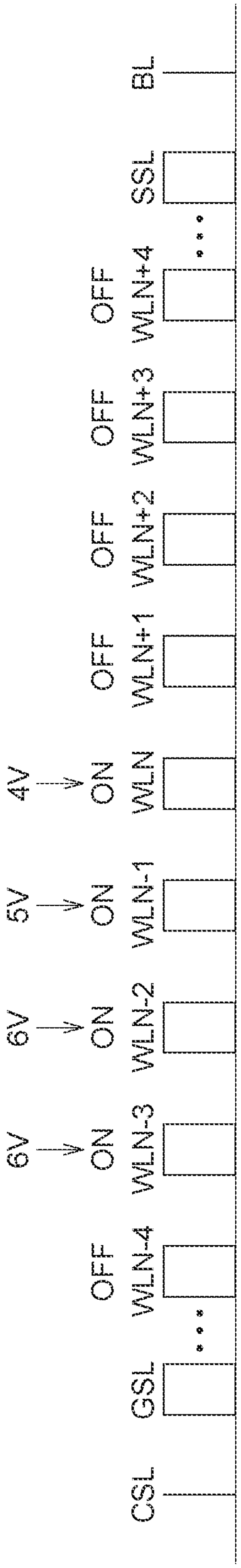

As shown in FIG. 4C, during the pre-charge phase, for example but not limited by, at least four word lines WLN−3~WLN are turned-on while other word lines are turned-off. The pre-charge voltages applied to the turned-on word lines WLN−3~WLN are 6V, 6V, 5V and 4V respectively, which are just for example and not to limit the application. As shown in FIG. 4C, at the boundary between the turned-on word line WLN (i.e. the target turned-on word line) and the next adjacent turned-off word line WLN+1 (i.e. the target turned-off word line), the voltage difference is 4V−0=4V, which is a small voltage difference. The small voltage difference reduces the HE effects and eliminates the reduction in the read window. Also, the program disturbance is eliminated and the performance of the memory device is kept.

Figure 4D:
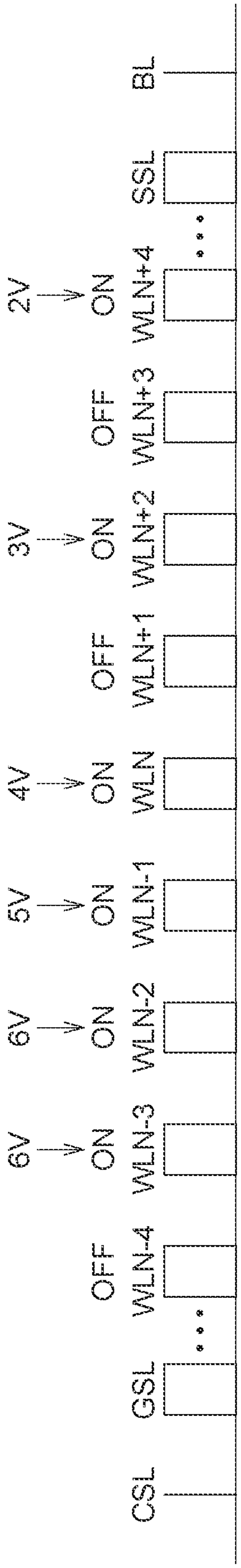

As shown in FIG. 4D, during the pre-charge phase, for example but not limited by, at least six word lines WLN−3~WLN, WLN+2 and WLN+4 are turned-on while other word lines are turned-off. The pre-charge voltages applied to the turned-on word lines WLN−3~WLN, WLN+2 and WLN+4 are 6V, 6V, 5V, 4V, 3V and 2V respectively, which are just for example and not to limit the application. As shown in FIG. 4D, at the boundary between the turned-on word line WLN (i.e. the target turned-on word line) and the next adjacent turned-off word line WLN+1 (i.e. the target turned-off word line), the voltage difference is 4V−0=4V; at the boundary between the turned-on word line WLN+2 (i.e. the target turned-on word line) and the next adjacent turned-off word line WLN+3 (i.e. the target turned-off word line), the voltage difference is 3V−0=3V; and at the boundary between the turned-on word line WLN+4 (i.e. the target turned-on word line) and the next adjacent turned-off word line WLN+5 (i.e. the target turned-off word line), the voltage difference is 2V−0=2V, which are small voltage differences. The small voltage differences may reduce the HE effects and eliminate the reduction in the read window. Also, the program disturbance is eliminated and the performance of the memory device is kept. As shown in FIG. 4D, the turned-on word lines are interval between the turned-off word lines, which are still within the spirit and the scope of the application.

Figure 4E:
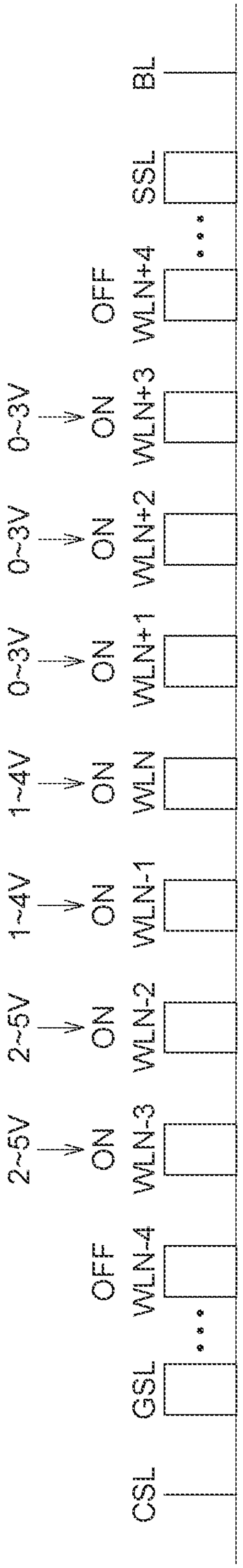

As shown in FIG. 4E, during the pre-charge phase, for example but not limited by, at least seven word lines WLN−3~WLN+3 are turned-on while other word lines are turned-off. The pre-charge voltages applied to the turned-on word lines WLN−3~WLN+3 are 2~5V, 2~5V, 1~4V, 1~4V, 0~3V, 0~3V and 0~3V respectively, which are just for example and not to limit the application. As shown in FIG. 4E, at the boundary between the turned-on word line WLN+3 (i.e. the target turned-on word line) and the next adjacent turned-off word line WLN+4 (i.e. the target turned-off word line), the voltage difference is (0~3V)−0=0~3V, which is a small voltage difference. The small voltage difference reduces the HE effects and eliminates the reduction in the read window. Also, the program disturbance is eliminated and the performance of the memory device is kept.

As described above, in one embodiment of the application, in order to reduce HE effects, during the pre-charge phase, (1) on the predetermined direction, a high voltage difference between the target turned-on word line and the next adjacent target turned-off word line is prevented, wherein as shown in FIG. 2, FIG. 3A to FIG. 3D and FIG. 4A to FIG. 4E, the predetermined direction is from the common source line CSL to the bit line BL; and (2) the pre-charge voltages applied to the turned-on word line may have many different pre-charge voltage settings, not limited by those shown in Table 1.

Figure 5:
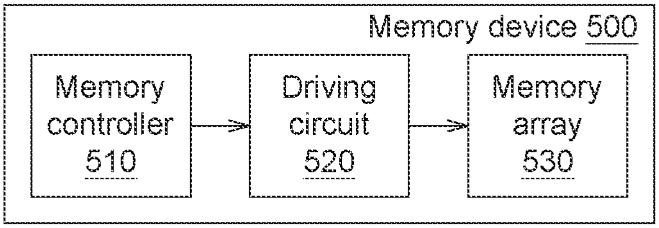
FIG. 5 shows a functional block diagram of a memory device according to one embodiment of the application.

FIG. 5 shows a functional block diagram of a memory device according to one embodiment of the application. As shown in FIG. 5, the memory device 500 according to one embodiment of the application includes a memory controller 510, a driving circuit 520 and a memory array 530. The memory controller 510 is coupled to the driving circuit 520 and controls the driving circuit 520. The driving circuit 520 is coupled to the memory array 530 and drives the memory array 530. Under control of the memory controller 510, during the pre-charge phase and the programming phase, the driving circuit 520 outputs a plurality of driving voltages (the pre-charge voltages, the programming voltages VPGM and the pass voltage VPASS) for driving the memory array 530 to pre-charge and program the memory array 530.

Figure 6:
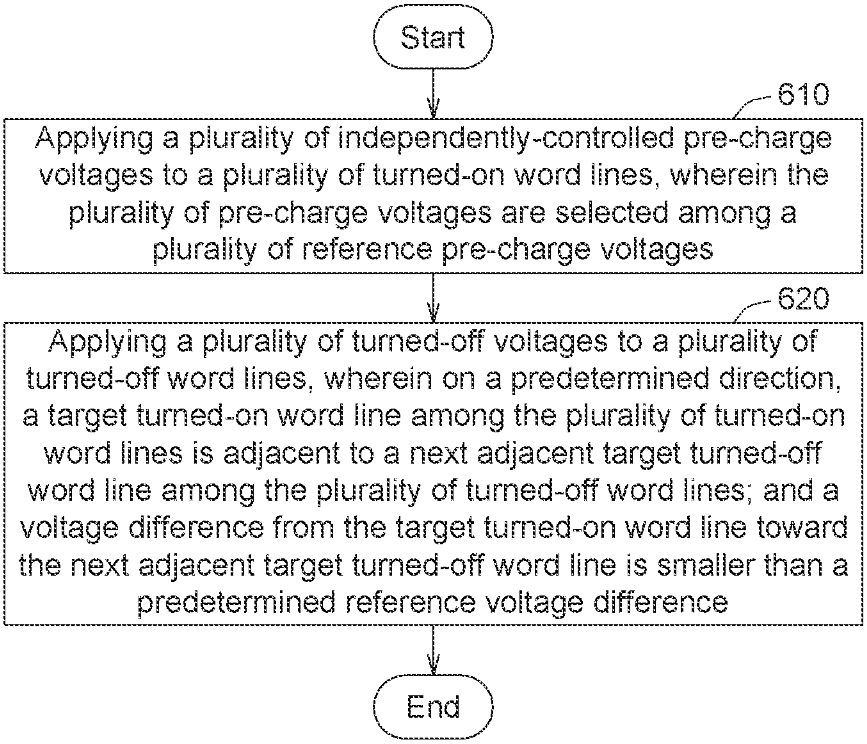
FIG. 6 shows a pre-charge method of a memory device according to one embodiment of the application.

FIG. 6 shows a pre-charge method of a memory device according to one embodiment of the application. The pre-charge method of the memory device according to one embodiment of the application includes: in step 610, applying a plurality of independently-controlled pre-charge voltages to a plurality of turned-on word lines, wherein the plurality of pre-charge voltages are selected among a plurality of reference pre-charge voltages; and in step 620, applying a plurality of turned-off voltages to a plurality of turned-off word lines, wherein on a predetermined direction, a target turned-on word line among the plurality of turned-on word lines is adjacent to a next adjacent target turned-off word line among the plurality of turned-off word lines; and a voltage difference from the target turned-on word line toward the next adjacent target turned-off word line is smaller than a predetermined reference voltage difference.

One embodiment of the application is applicable in two-dimension (2D) or three-dimension (3D) memory device. Further, one embodiment of the application is applicable in single-level cell (SLC) memory devices, multi-level cell (MLC) memory devices, triple-level cell (TLC) memory devices, quad-level cell (QLC) memory devices and so on.

In one embodiment of the application, the pre-charge method may improve program disturbance because a high voltage difference between the target turned-on word lines and the next adjacent target turned-off word lines is prevented. By so, HE effects are eliminated and thus a larger read window is obtained.

While this document may describe many specifics, these should not be construed as limitations on the scope of an invention that is claimed or of what may be claimed, but rather as descriptions of features specific to particular embodiments. Certain features that are described in this document in the context of separate embodiments can also be implemented in combination in a single embodiment. Conversely, various features that are described in the context of a single embodiment can also be implemented in multiple embodiments separately or in any suitable sub-combination. Moreover, although features may be described above as acting in certain combinations and even initially claimed as such, one or more features from a claimed combination in some cases can be excised from the combination, and the claimed combination may be directed to a sub-combination or a variation of a sub-combination. Similarly, while operations are depicted in the drawings in a particular order, this should not be understood as requiring that such operations be performed in the particular order shown or in sequential order, or that all illustrated operations be performed, to achieve desirable results.

Only a few examples and implementations are disclosed. Variations, modifications, and enhancements to the described examples and implementations and other implementations can be made based on what is disclosed.

What is claimed is:

1. A pre-charge method for a memory device, the pre-charge method comprising:

applying a plurality of independently-controlled pre-charge voltages to a plurality of turned-on word lines, wherein the plurality of pre-charge voltages are selected among a plurality of reference pre-charge voltages; and applying a plurality of turned-off voltages to a plurality of turned-off word lines, wherein on a predetermined direction, a target turned-on word line among the plurality of turned-on word lines is adjacent to a next adjacent target turned-off word line among the plurality of turned-off word lines; and a voltage difference from the target turned-on word line toward the next adjacent target turned-off word line is smaller than a predetermined reference voltage difference, and wherein the predetermined reference voltage difference is corresponding to a voltage difference between a highest reference pre-charge voltage of the plurality of reference pre-charge voltages and a lowest reference pre-charge voltage of the plurality of reference pre-charge voltages.

2. The pre-charge method for the memory device according to claim 1, wherein the predetermined direction is from a common source line toward to a bit line; and at a boundary between the target turned-on word line and the next adjacent target turned-off word line, a voltage of the common source line is gradually decreased.

3. The pre-charge method for the memory device according to claim 1, wherein the pre-charge voltage applied to a non-target turned-on word line among the plurality of turned-on word lines is a first reference pre-charge voltage, a second reference pre-charge voltage or a third reference pre-charge voltage of the plurality of reference pre-charge voltages, the first reference pre-charge voltage is higher than the second reference pre-charge voltage and the second reference pre-charge voltage is higher than the third reference pre-charge voltage; and the pre-charge voltage applied to the at least one target turned-on word line is the second reference pre-charge voltage or the third reference pre-charge voltage.

4. The pre-charge method for the memory device according to claim 1, wherein a turned-off word line among the plurality of turned-off word lines is interleaved between the plurality of turned-on word lines.

5. A memory device comprising:

a memory array;

a driving circuit coupled to and driving the memory array; and a memory control circuit coupled to and controlling the driving circuit, wherein in a pre-charge phase, under control of the memory control circuit, the driving circuit applies a plurality of independently-controlled pre-charge voltages to a plurality of turned-on word lines of the memory array, wherein the plurality of pre-charge voltages are selected among a plurality of reference pre-charge voltages; and under control of the memory control circuit, the driving circuit applies a plurality of turned-off voltages to a plurality of turned-off word lines of the memory array, wherein on a predetermined direction, a target turned-on word line among the plurality of turned-on word lines is adjacent to a next adjacent target turned-off word line among the plurality of turned-off word lines; and a voltage difference from the target turned-on word line toward the next adjacent target turned-off word line is smaller than a predetermined reference voltage difference, and wherein the predetermined reference voltage difference is corresponding to a voltage difference between a highest reference pre-charge voltage of the plurality of reference pre-charge voltages and a lowest reference pre-charge voltage of the plurality of reference pre-charge voltages.

6. The memory device according to claim 5, wherein the predetermined direction is from a common source line toward to a bit line; and at a boundary between the target turned-on word line and the next adjacent target turned-off word line, a voltage of the common source line is gradually decreased.

7. The memory device according to claim 5, wherein the pre-charge voltage applied to a non-target turned-on word line among the plurality of turned-on word lines is a first reference pre-charge voltage, a second reference pre-charge voltage or a third reference pre-charge voltage of the plurality of reference pre-charge voltages, the first reference pre-charge voltage is higher than the second reference pre-charge voltage and the second reference pre-charge voltage is higher than the third reference pre-charge voltage; and the pre-charge voltage applied to the at least one target turned-on word line is the second reference pre-charge voltage or the third reference pre-charge voltage.

8. The memory device according to claim 5, wherein a turned-off word line among the plurality of turned-off word lines is interleaved between the plurality of turned-on word lines.

* * * * *